June 30, 1959 R. F. SHAW 2,892,933

FREQUENCY DIVIDER

Filed Dec. 16, 1953 4 Sheets-Sheet 1

INVENTOR
ROBERT F. SHAW
BY S.C. Yuter
ATTORNEY

PLUSE AMPLIFIER 90 SYMBOL

INVENTOR.
ROBERT F. SHAW
BY S.C. Yuter
ATTORNEY.

RESHAPER 128 SYMBOL

RESHAPER 128

AMPLIFIER 148 SYMBOL

D-C AMPLIFIER 148

FLIP FLOP 240 SYMBOL

SET DOMINANT FLIP FLOP 240

FLIP FLOP 258 SYMBOL

RESET DOMINANT FLIP FLOP 258

INVENTOR.
ROBERT F. SHAW
BY S.C. Yuter
ATTORNEY.

June 30, 1959 R. F. SHAW 2,892,933

FREQUENCY DIVIDER

Filed Dec. 16, 1953 4 Sheets-Sheet 4

INVENTOR.
ROBERT F. SHAW

BY S. C. Yuter

ATTORNEY.

United States Patent Office 2,892,933

Patented June 30, 1959

2,892,933

FREQUENCY DIVIDER

Robert F. Shaw, New York, N.Y., assignor to Underwood Corporation, New York, N.Y., a corporation of Delaware Application December 16, 1953, Serial No. 398,559

16 Claims. (Cl. 250—27)

This invention relates to a frequency dividing system and, more particularly, to an improved frequency divider capable of producing, with stability and reliability, a periodic signal whose frequency is a sub-multiple of the frequency of a periodic input signal.

It has been customary, where a signal of relatively constant frequency is to be divided in frequency by a quantity which is an integral power of two, to use a series of free-running multivibrators connected in cascade as a frequency dividing system. However, this arrangement limits the frequency division to powers of two and often leads to phase errors and instability since small disturbances can cause one of the multivibrators to skip a beat.

If the free-running multivibrators are replaced by a precision binary counter, of the type used in computers, instability can be greatly reduced but the cost of the equipment and the number of stages required is likely to become prohibitive, especially for high ratios of frequency division. Thus, for example, since each stage of the binary counter is capable of dividing by two, if a frequency division of $f/(3\times10^5)$ were desired then an eighteen stage binary counter would be necessary. Furthermore, since $3\times10^5$ is not an integral power of two, a coincidence circuit, coupled to various stages of the binary counter would be necessary in order to detect the particular number, give an output pulse, and restart the counter chain from zero after the desired number of input pulses have been received.

Another type of frequency dividing system used in computer work includes a recirculating delay line register, a unit adder, and a coincidence circuit. In such a dividing system, the unit adder causes the number, in binary form, circulating in the register to be numerically increased by one for each pulse applied to the unit adder. When the number circulating in the register reaches a predetermined value, as for example ninety-nine, governed by the amount of frequency division desired, in this case $f/100$, the coincidence circuit is activated by the next input pulse, which would be the one hundredth pulse, to produce an output pulse. The output pulse is also utilized to clear the register for repeating the process. This process results in a signal whose frequency is a sub-multiple of the frequency of the input signal ($f/100$ in the example).

This type of frequency divider eliminates any practical limitation on the division of frequency and greatly reduces the number of tubes required, particularly where high frequency division ratios are desired. However, the input pulses must be spaced far enough apart, in accordance with the capacity of the recirculating register, to permit each input pulse to be applied to the unit adder at a time such that a binary digit one may be added to the least significant digit of the number circulating in the register. Thus, for a sixteen pulse-time delay recirculating register, the frequency of the input signal would have to be $f/16$. This would preclude conversion of a sinusoidal signal into a pulse signal of fifty percent duty cycle and feeding the pulse signal directly into such a frequency dividing system, as the time interval would be too short. The desired result could theoretically be achieved by greatly narrowing the input pulses and using some type of frequency multiplier to obtain retiming and reshaping pulses (i.e., clock pulses) for the recirculating register, but using this arrangement, refined sufficiently to maintain the required phase accuracy, would in all probability be less economical than using a multistage binary counter and coincidence circuit.

The present invention is directed toward obtaining some of the advantages of both systems while eliminating the disadvantages.

Accordingly, it is an object of the present invention to provide a frequency dividing system capable of producing high frequency division with a minimum of equipment.

Another object of the invention is the provision of an electronic frequency divider capable of producing a periodic signal whose frequency may be chosen to be any sub-multiple of the frequency of the input signal, and which is particularly adaptable to high frequency division ratios.

A further object of the invention is the provision of a frequency divider which is stable and reliable in its operation, especially at high frequency division ratios.

A still further object of the invention is the provision of a frequency divider whose output signals have a very closely maintained phase relationship to its input signals, even at high frequency division ratios.

The present invention permits the frequency division of a periodic electrical signal of relatively constant fundamental frequency $f$ by a large integer $x$ for deriving a signal having a predetermined frequency equal to $f/x$.

To accomplish this according to one embodiment of the invention a binary counter is provided being responsive to the fundamental frequency signal for producing signals having a frequency equal to the fundamental frequency $f$ divided by a chosen radix raised to an integral power, as for example $2^n$. A recirculating register is provided being responsive to the signal produced by the binary counter such that the number circulating in the register is numerically increased by one for each pulse of the signal applied thereto. A coincidence circuit is coupled to the recirculating register in such a manner that when the number $m-1$ is circulating in the recirculating register it conditions the coincidence circuit to detect the next pulse, that is, the $m^{th}$ output pulse from the binary counter to produce an output pulse and clear the recirculating register. The binary counter restarts from zero after the production of the $m^{th}$ pulse and repeats the process for obtaining a signal having a frequency of $f/x$, where $x$ equals $(2^n\times m)$.

Thus, for example, if $2^n$ had a value equal to $2^4$ or sixteen and the predetermined number $m$ had a value equal to twenty thousand then the output signal would have a frequency equal to $f/(16\times20{,}000)$ or $f/3.2\times10^5$.

Accordingly, this system would require only a four stage binary counter to produce a signal having a frequency in the range of that produced by a frequency divider composed of an eighteen stage cascaded binary counter. Further, in view of preliminary frequency division by the four stage binary counter, the output pulses from the binary counter are spaced far enough apart to use the recirculating register-coincidence type of frequency divider to achieve large division ratios with high phase accuracy.

For further objects, and for a better understanding of the invention the following detailed description is given in connection with the accompanying drawings, in which:

Fig. 1 is a schematic diagram, in simplified block form, of a frequency dividing system embodying the invention with another embodiment shown in dotted outline.

Figs. 2 to 9 inclusive illustrate the logical symbols which are used to describe the logical diagram of the schematic block diagram, and include the circuits of the logical symbols.

Fig. 2 shows the logical symbol for a gate.

Fig. 2a schematically illustrates the circuit of a gate.

Figure 8:
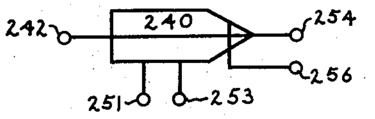
Fig. 8 shows the logical symbol for a set dominant flip-flop.
Figure 8A:
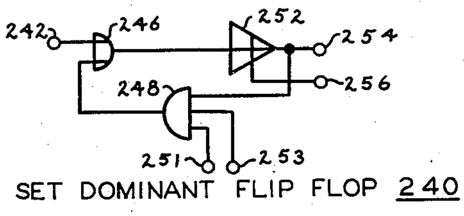

Fig. 8a diagrammatically shows the logical circuit of the set dominant flip-flop.

Figure 9:
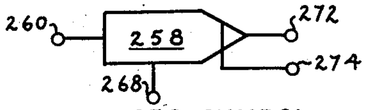

Fig. 9 shows the logical symbol of a reset dominant flip-flop.

Figure 9A:
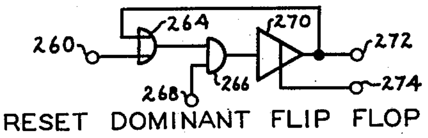

Fig. 9a illustrates the logical details of the reset dominant flip-flop.

Figure 1:
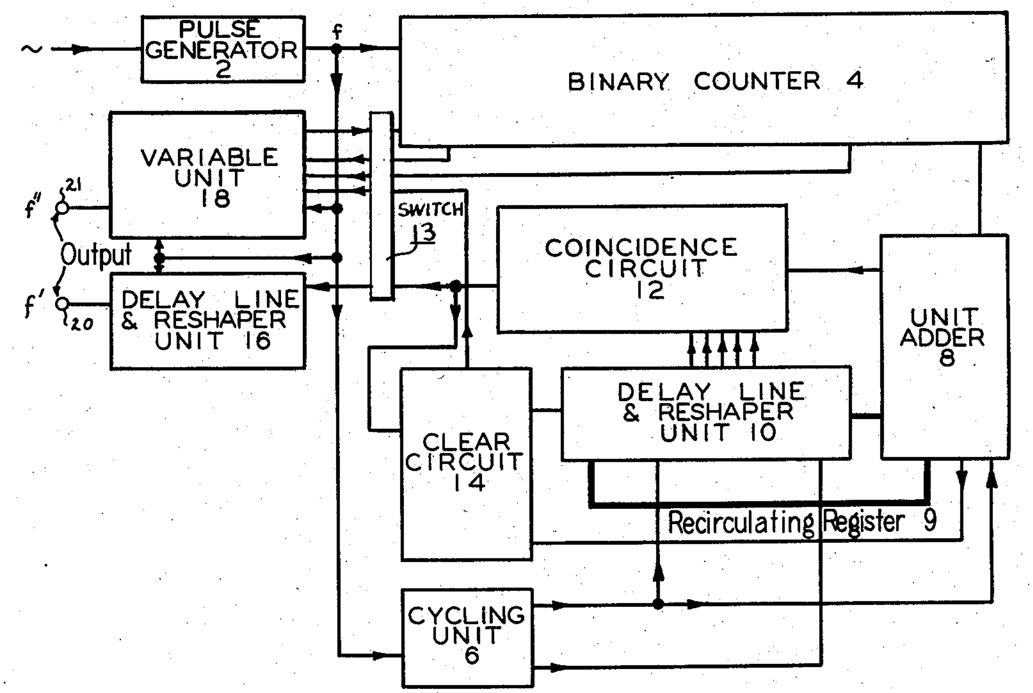
Figure 10:
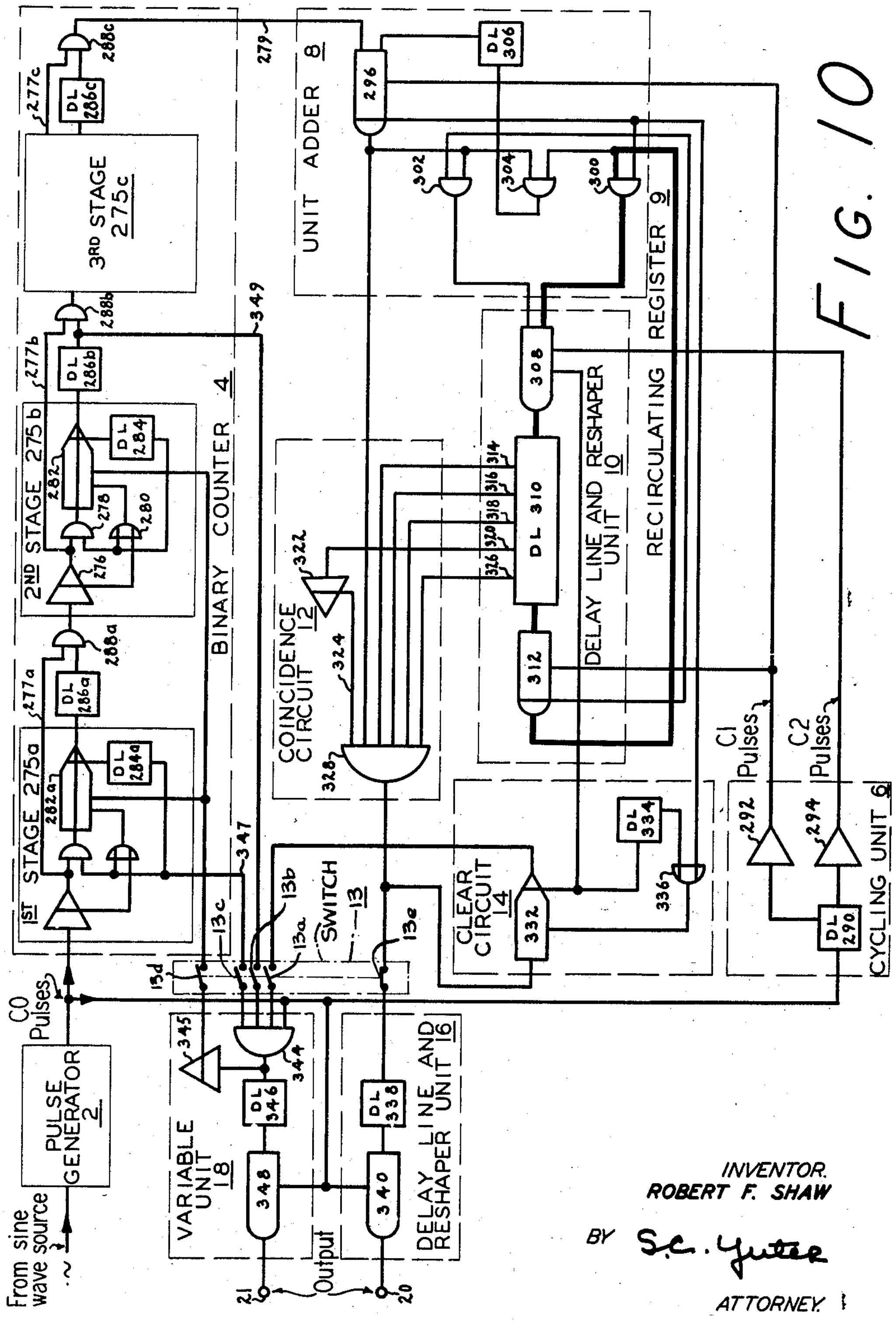

Fig. 10 is a detailed logical diagram of the frequency dividing system shown in Fig. 1.

Figure 11:
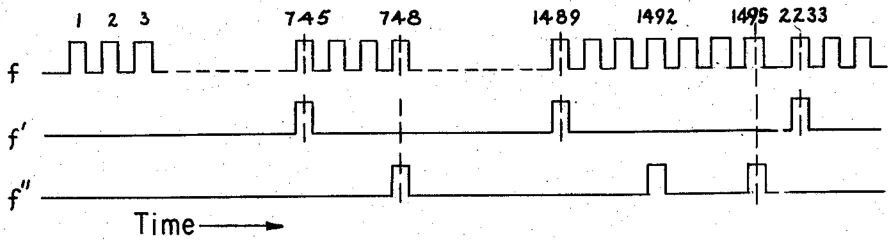

Fig. 11 is a waveform graph intended to illustrate the typical frequency division ratios obtainable with the system of the present invention.

*General description*

Referring now to the frequency dividing system shown in Fig. 1, an input signal of relatively constant frequency, such as a sinusoidal signal, is applied to the pulse generator 2 which converts the input signal into a pulse signal of relatively constant frequency, hereinafter referred to as the fundamental frequency. If the input signal consists of square pulses of approximately 50 percent duty cycle, the pulse generator may be omitted.

The pulse signal is applied to a binary counter 4 and a cycling unit 6. The binary counter 4 is used to divide the fundamental frequency by some predetermined integral power of two. The cycling unit 6 provides a series of cyclical signals used for retiming and reshaping purposes.

Each time the binary counter 4 exceeds its capacity a pulse is applied to a unit adder 8. The unit adder 8 forms part of a recirculating register 9 which also includes a delay line and reshaper unit 10. The unit adder 8 causes the number circulating in the recirculating register 9 to be numerically increased by one for each pulse applied to the unit adder 8.

A coincidence circuit 12 is connected to the recirculating register 9 in such a manner that when a predetermined number is circulating in the recirculating register 9, it conditions the coincidence circuit 12 to pass via the unit adder 8 the next pulse produced by the binary counter 4.

The output of the coincidence circuit 12 is connected to a clear circuit 14 and a delay line and reshaper unit 16. The clear circuit 14 is connected to the recirculating register 9 and responds to a control pulse produced by the coincidence circuit 12 for clearing the recirculating register 9 before the next pulse is applied to the unit adder 8 from the binary counter 4. This permits the building up of the same predetermined number repeatedly in the recirculating register 9 and thereby repeating the process to obtain frequency division.

The next pulse produced by the binary counter 4 is applied via the unit adder 8 to the clear circuit 14 causing it to be reset and prepared for the next control pulse from the coincidence circuit 12.

The fundamental frequency signal produced by the pulse generator 2 is also fed to the delay line and reshaper unit 16 to properly shape and time each control pulse before it is applied to the output terminal 20.

Thus, the signal at the output terminal 20 will be in phase with the fundamental frequency signal and will have a frequency $f'$ which is a predetermined sub-multiple of the fundamental frequency. The predetermined number will be governed by two factors, one being the capacity of the binary counter 4 and the other being the connections between the recirculating register 9 and the coincidence circuit 12. For example, a three stage binary counter 4 may be used to divide the fundamental frequency by a factor of eight. The pulse period of the recirculating register 9 is governed by the capacity of the binary counter 4 such that each output pulse from the binary counter 4 is applied to the unit adder 8 at a time when a binary digit one is to be added to the least significant digit of the number circulating in the recirculating register 9. Therefore, if the first factor is eight, then an eight pulse period recirculating register 9 is used to store an integral number, in binary form, having any value up to the numerical capacity of the recirculating register 9, which in this case is $(2^8-1)$ or 255. Since the number in the recirculating register 9 is increased by one for each output pulse produced by the binary counter 4, the predetermined frequency of the pulse signal at the output of the system will be equal to the fundamental frequency divided by a predetermined integral multiple of eight, that is by $8m$, where $m$ is any predetermined integral number having a value up to the numerical capacity of the recirculating register 9. In the example given, when $m$ can be at most 255, a division ratio of $(8\times255)$ or 2040 is possible.

Therefore, if the integral multiple number is chosen to be ninety-three, for example, the output signal would have a frequency of $f/(8\times93)=f/744$ or if the integral multiple number is chosen to be ninety-four, for example, the output signal would have a frequency of $f/(8\times94)=f/752$. Thus, the fundamental frequency may be divided by any integral multiple of eight in accordance with the chosen predetermined integral number.

To provide output signals having a frequency equal to the fundamental frequency divided by an integral number having a value intermediate successive multiples of eight, as for example $f/747$, an additional structure may be connected into the system by operation of the switch unit 13 shown in Fig. 1. The coincidence circuit 12 is connected via clear circuit 14 and switch unit 13 to a variable unit 18 and is disconnected from the delay line and reshaper unit 16 by switch unit 13. The variable unit 18 is also connected by switch unit 13 to the binary counter 4, the pulse generator 2 and to an output terminal 21.

The modified system operates in the same manner as previously described except that the control pulse from the coincidence circuit 12, representing some integral multiple of eight, is now applied via the clear circuit 14 to initially condition the variable unit 18. The variable unit 18 is connected to the binary counter 4 and the pulse generator 2 in such a manner that during the next cycle of operation of the binary counter 4 it further conditions the variable unit 18 to detect a predetermined pulse produced by the pulse generator 2. The predetermined pulse is reshaped in accordance with the fundamental frequency signal before being applied to the output terminal 21 and is also used to reset the binary counter 4 to thereby restart the process to obtain frequency division.

Thus, the frequency $f''$ of the pulse signal at the output terminal 21 of the modified system will be equal to the fundamental frequency divided by a predetermined number having a value intermediate successive integral multiples of eight, that is by $(8m+s)$ where $m$ is a predetermined integral number having a value up to the capacity of the recirculating register 9 and $s$ is a predetermined integral number having a value less than the capacity of the binary counter 4.

Therefore, if $m$ is chosen to be ninety-three and $s$ is chosen to be three, for example, the output signal of the modified system would have a frequency equal to $f/[(8\times93)+3]$ or $f/747$

*Description of symbols*

The schematic equivalents of the symbols which are hereinafter employed to simplify the detailed description of the units of the frequency dividing system which have been illustrated in block form are shown in Figs. 2 through 9. For convenient reference, all positive and negative supply buses will generally be identified with a number corresponding with their voltage. The circuitry terminals corresponding to the same symbol terminals are identified by the same character reference numbers.

*Gate*

The gates used in the frequency dividing system are of the "coincidence" type, each comprising a crystal diode network which functions to receive input signals via a plurality of input terminals and to pass the most negative signal.

Figure 2:
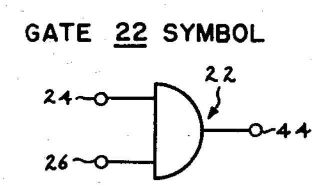

The symbol for a representative gate 22, having two input terminals 24 and 26, is shown in Fig. 2. Since the signal potential levels in the system are plus five volts (sometimes called positive signals) and minus ten volts (sometimes called negative signals), the potentials of the signals which may exist at the input terminals 24 and 26 are thereby limited.

If a potential of minus ten volts is present at one or both of the input terminals 24 and 26, a potential of minus ten volts will exist at the output terminal 44. Therefore, if one of the input signals to the input terminals 24 and 26 is positive and the other signal is negative, the negative signal is passed and the positive signal is "blocked."

When there is a coincidence of positive signals at the two input terminals 24 and 26, a positive signal is transmitted from the output terminal 44. In such case, it may be stated that a positive signal is "gated" or "passed" by the gate 22. When all of the input signals to a gate except one are made positive, in preparation for passing a positive signal when the remaining input signal is made positive, the gate may be described as being "primed."

Figure 2A:
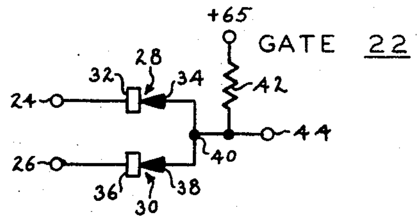

The schematic details of the gate 22 are shown in Fig. 2*a*. Gate 22 includes the crystal diodes 28 and 30. Each of the input terminals 24 and 26 is coupled to one of the crystal diodes 28 and 30. Crystal diode 28 comprises the cathode 32 and the anode 34. Crystal diode 30 comprises the anode 38 and the cathode 36. More particularly, the input terminals 24 and 26 are respectively coupled to the cathode 32 of the crystal diode 28 and the cathode 36 of the crystal diode 30. The anode 34 of the crystal diode 28 and the anode 38 of the crystal diode 30 are interconnected at the junction 40. The anodes 34 and 38 are coupled via the resistor 42 to the positive voltage bus 65.

If negative potentials are simultaneously present at the input terminals 24 and 26, both of the crystal diodes 28 and 30 will conduct, since the positive supply bus 65 tends to make the anodes 34 and 38 more positive. The voltage at the junction 40 will then be minus ten volts since, while conducting, the anodes 34 and 38 of the crystal diodes 28 and 30 assume the potential of the associated cathodes 32 and 36.

When a positive signal is fed only to the input terminal 24, the cathode 32 is raised to a positive five volts potential and is made more positive than the anode 34, so that crystal diode 28 stops conducting. As a result, the potential at the junction 40 remains at the negative ten volts level. In a similar manner, when a positive signal is only present at the input terminal 26, the voltage at the junction 40 will not be changed.

When the signals present at both input terminals 24 and 26 are positive, the anodes 34 and 38 are raised to approximately the same potential as their associated cathodes 32 and 36 and the potential at the junction 40 rises to a positive potential of five volts.

The potential which exists at the junction 40 is transmitted from the gate 22 via the connected output terminal 44.

In the above described manner, the gate 22 is frequently used as a switch to govern the passage of one signal by the presence of one or more signals which control the operation of the gate 22.

It should be understood that the potentials of plus five volts and minus ten volts used for purpose of illustration are approximate, and the exact potentials will be affected in two ways. First, they will be affected by the value of the resistance 42 and its relation to the impedances of the input circuits connected to the input terminals 24 and 26. Second, they will be affected by the fact that a crystal diode has some resistance (i.e., is not a perfect conductor) when its anode is more positive than its cathode, and furthermore will pass some current (i.e., does not have infinite resistance) when its anode is more negative than its cathode. Nevertheless, the assumption that signal potentials are either plus five or minus ten volts is sufficiently accurate to serve as a basis for the description of the operation taking place in the system.

*Buffer*

The buffers used in this frequency dividing system are also known as "or" gates. Each buffer comprises a crystal diode network which functions to receive input signals via a plurality of input terminals and to pass the most positive signal.

Figure 3:
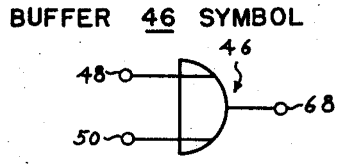
Fig. 3 shows the logical symbol for a buffer.

The symbol for a representative buffer 46, having two input terminals 48 and 50, is shown in Fig. 3. Since the signal potential levels in the system are minus ten volts and plus five volts, either one of these potentials may exist at the input terminals 48 and 50.

If a positive potential of five volts exists at one or both of the input terminals 48 or 50, a positive potential of five volts will exist at the output terminal 68. If a negative potential of ten volts is present at both of the input terminals 48 and 50, a negative potential of ten volts will be present at the output terminal 68.

Figure 3A:
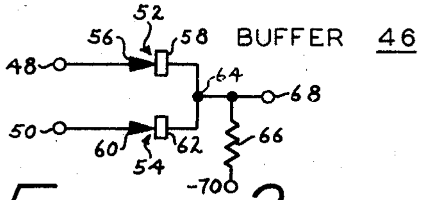
Fig. 3a shows the circuit of a buffer.

The schematic details of the buffer 46 are shown in Fig. 3*a*. The buffer 46 includes the two crystal diodes 52 and 54. The crystal diode 52 comprises the anode 56 and the cathode 58. Crystal diode 54 comprises the anode 60 and the cathode 62. The anode 56 of the crystal diode 52 is coupled to the input terminal 48. The anode 60 of the crystal diode 54 is coupled to the input terminal 50. The cathodes 58 and 62 of the crystal diodes 52 and 54, respectively, are joined at the junction 64 which is coupled to the output terminal 68, and via the resistor 66 to the negative supply bus 70. The negative supply bus 70 tends to make the cathodes 58 and 62 more negative than the anodes 56 and 60, respectively, causing both crystal diodes 52 and 54 to conduct.

When negative ten volt signals are simultaneously present at input terminals 48 and 50, the crystal diodes 52 and 54 are conductive, and the potential at the cathodes 58 and 62 approaches the magnitude of the potential at the anodes 56 and 60. As a result, a negative potential of ten volts appears at the output terminal 68.

If the potential at one of the input terminals 48 or 50 increases to plus five volts, the potential at the junction 64 approaches the positive five volts level as this voltage is passed through the conducting crystal diode 52 or 54 to which the voltage is applied. The other crystal diode 52 or 54 stops conducting since its anode 56 or 60 becomes more negative than the junction 64. As a result, a positive potential of five volts appears at the output terminal 68.

If positive five volt signals are fed simultaneously to both input terminals 48 and 50, a positive potential of five volts appears at the output terminal 68, since both crystal diodes 52 and 54 will remain conducting. Thus the buffer 46 functions to pass the most positive signal received via the input terminals 48 and 50.

*Delay line*

Figure 4:
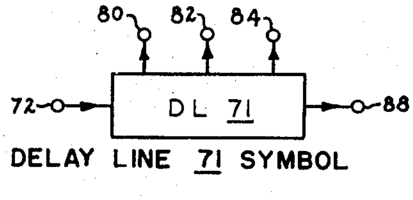
Fig. 4 shows the logical symbol for a delay line.

The symbol for a representative electrical delay line 71 which is a lumped parameter type delay line and which functions to delay received pulses for discrete periods of time, is shown in Fig. 4.

The delay line 71 comprises the input terminal 72, the output terminal 88, and a plurality of taps 80, 82 and 84. A pulse which is fed via the input terminal 72 to the delay line 71 will be delayed for an increasing number of pulse times before successively appearing at the taps 80, 82 and 84. When the pulse reaches the output terminal 88, the total delay provided by the delay line 71 has been applied. In the text which follows, the specific number of pulse-times delay which is encountered before a pulse travels from the input terminal to a tap of the delay line will be stated.

Figure 4A:
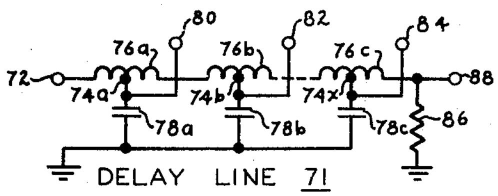
Fig. 4a illustrates the schematic circuitry of a delay line.

The delay line 71 shown in Fig. 4*a* comprises a plurality of inductors 76 connected in series, with the associated capacitors 78 which couple a point 74 on each inductor 76 to ground. A signal is fed into the delay line 71 at the input terminal 72 and the maximum delay occurs at the output terminal 88. The taps 80, 82 and 84 are each connected to one of the points 74 and provide varied delays. The delay line 71 is terminated by a resistor 86 in order to prevent reflections. Although in the delay line of Fig. 4*a* a tap is shown connected to each of the points 74, it should be understood that in actual practice there are ordinarily several untapped points 74 between successive taps.

*Pulse amplifier*

Figure 5:
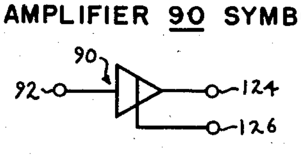
Fig. 5 illustrates the logical symbol for a pulse amplifier.

The symbol for a representative pulse amplifier is shown in Fig. 5. When a positive pulse is fed to the pulse amplifier 90 via the input terminal 92, the pulse amplifier 90 functions to transmit a positive pulse which swings from minus ten to plus five volts from its positive output terminal 124, and a negative pulse which swings from plus five to minus ten volts from its negative output terminal 126. At all other times, the pulse amplifier 90 has a negative potential of ten volts at its positive output terminal 124 and a positive potential of five volts at its negative output terminal 126.

Figure 5A:
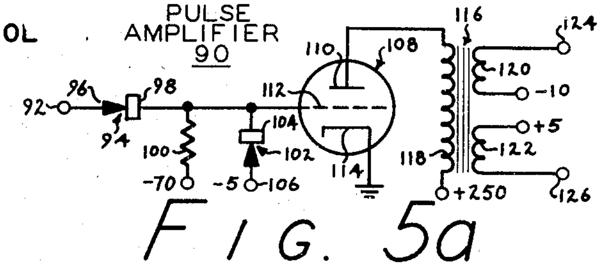
Fig. 5a is a schematic diagram of the pulse amplifier.

The detailed circuitry of the pulse amplifier 90 is shown in Fig. 5*a*. The pulse amplifier 90 includes the vacuum tube 108, the pulse transformer 116 and associated circuitry. The vacuum tube 108 comprises the cathode 114, the grid 112 and the anode 110. The pulse transformer comprises the primary winding 118 and the secondary windings 120 and 122.

The crystal diode 94 couples the grid 112 of the vacuum tube 108 to the input terminal 92, the anode 96 of the crystal diode 94 being coupled to the input terminal 92, and the cathode 98 being coupled to the grid 112. The negative supply bus 70 is coupled to the grid 112 via the resistor 100 and tends to make the crystal diode 94 conductive. The grid 112 and the cathode 98 of the crystal diode 94 are also coupled to the cathode 104 of the crystal diode 102, whose anode 106 is coupled to the negative supply bus 5. The crystal diode 102 clamps the grid 112 at a potential of minus five volts thus preventing the voltage applied to the grid 112 from becoming more negative than minus five volts.

When a voltage more positive than minus five volts is transmitted to the input terminal 92, the crystal diode 94 conducts and the voltage is applied to the grid 112. Since the crystal diode 102 clamps the grid 112 and the cathode 98 of the crystal diode 94 at minus five volts, any voltage more negative than minus five volts will cause the crystal diode 94 to become nonconductive, and that input voltage will be blocked at the crystal diode 94. Thus, the clamping action of the crystal diode 102 will not affect the circuitry which supplies the input voltage.

The cathode 114 of the vacuum tube 108 is connected to ground potential. The anode 110 of the vacuum tube 108 is coupled by the primary winding 118 of the pulse transformer 116 to the positive supply bus 250. The outer ends of the secondary windings 120 and 122 of the pulse transformer 116 are coupled respectively to the positive output terminal 124 and the negative output terminal 126. The inner ends of the secondary windings 120 and 122 are coupled respectively to the negative supply bus 10 and the positive supply bus 5.

A positive pulse which is fed to the grid 112 of the vacuum tube 108 will be inverted at the primary winding 118 of the pulse transformer 116 which is wound to produce a positive pulse in the secondary winding 120 and a negative pulse in the secondary winding 122. These pulses respectively drive the positive output terminal 124 up to a positive five volts potential and the negative output terminal 126 down to a negative ten volts potential because of the circuit parameters.

When the vacuum tube 108 is non-conducting, the negative ten volts potential is fed through the secondary winding 120 and appears at the positive output terminal 124. At the same time, the positive five volts potential is fed through the secondary winding 122 to the negative output terminal 126. These latter conditions are the normally existing conditions at the output terminals 124 and 126.

Hereinafter, the pulse amplifier may be referred to simply as an amplifier and the fact that the amplifier is a pulse amplifier will be apparent from the use of the symbol shown in Fig. 5.

*Reshaper*

A reshaper of the type used in the frequency dividing system is an electronic circuit which functions to reshape and retime positive pulses which have become poorly shaped and attenuated.

Figure 6:
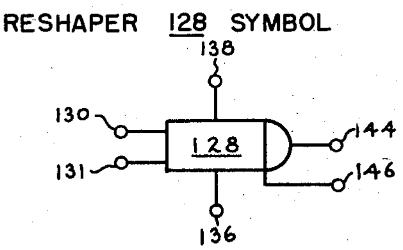
Fig. 6 shows the logical symbol for a reshaper.

The symbol for a representative reshaper 128 is illustrated in Fig. 6 and comprises one or more input terminals of which the input terminals 130 and 131 are shown, timing terminal 138 which receives reshaping and retiming pulses (also designated clocking or C pulses), positive output terminal 144, negative output terminal 146, and blocking terminal 136 through which signals may be sent to make the reshaper 128 inoperative.

Except when positive pulses are fed to the input terminals 130 and 131 of the reshaper 128, a negative potential of ten volts is present at the positive output terminal 144 and a positive potential of five volts exists at the negative output terminal 146.

When a pulse is fed to the reshaper 128 via one or both of the input terminals 130 and 131, the pulse is reshaped by a clock pulse (received via the terminal 138), which is timed to delay the reshaped pulse for one-quarter of a pulse time, and is then transmitted from the reshaper 128 via the positive output terminal 144. While the positive pulse is being transmitted from the positive output terminal 144, a negative pulse is transmitted from the negative output terminal 146.

Figure 6A:
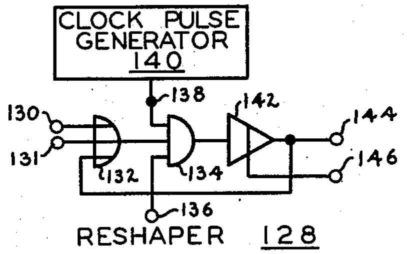
Fig. 6a illustrates the logical details of the reshaper.

The detailed circuitry of the reshaper 128 is illustrated in Fig. 6*a* in which use is made of logical symbols previously described.

The reshaper 128 comprises the buffer 132, the gate 134 and the pulse amplifier 142 connected in series. A positive pulse which is fed via one or both of the input terminals 130 and 131 of the buffer 132 is passed to the gate 134. Signals may also be fed via the blocking terminal 136 to the gate 134 and if the signal is negative, the gate 134 is blocked and the reshaper 128 is inoperative. The blocking terminal 136 is generally absent and if present usually receives a positive signal.

A series of identical clock pulses which are generated in the clock pulse generator, as will later be described in detail, are transmitted to the gate 134 via the clock terminal 138. The clock pulses are equal in magnitude and width to the desired shape and timing of the pulses which are to be reshaped and retimed. The clock pulses are timed so that the starting time of each clock pulse coincides approximately with the center of the pulse it is intended to reshape. This is done to assure that the pulse to be reshaped will have reached its maximum amplitude by the time the leading edge of a clock pulse arrives at the gate 134. Since in many cases the pulse to be reshaped is originally produced by a previous reshaper and thus has approximately the same width as a clock pulse, its center point will be one-quarter pulse time later than the leading edge of the clock pulse which previously reshaped it. Hence its leading edge after passing through the new reshaper will be one-quarter pulse time later than before, and on this basis it may be said that a reshaper introduces a one-quarter pulse time delay in the signals passing through it.

When the attenuated positive pulse reaches its full magnitude at the gate 134, the coinciding clock pulse is gated through to the amplifier 142 and is amplified and causes a positive pulse to be transmitted from the positive output terminal 144, and a negative pulse to be transmitted from the negative output terminal 146 at the same time.

The positive output terminal 144 is also coupled to one input of the buffer 132 so that a positive signal which appears at the positive output terminal 144 is regenerative and will continue to exist until the clock pulse terminates at the gate 134. This effectively permits the entire clock pulse to be gated through the gate 134, even though the original pulse has decayed before the end of the clock pulse.

Stated more generally, a clock pulse is passed through the gate 134 from the earliest coincidence of that clock pulse with the full magnitude of the attenuated pulse until the termination of that clock pulse. As a result, a clock pulse is substituted for the attenuated pulse in the system after a delay of one-quarter of a pulse time.

*D.-C. amplifier*

Figures 7, 7A:
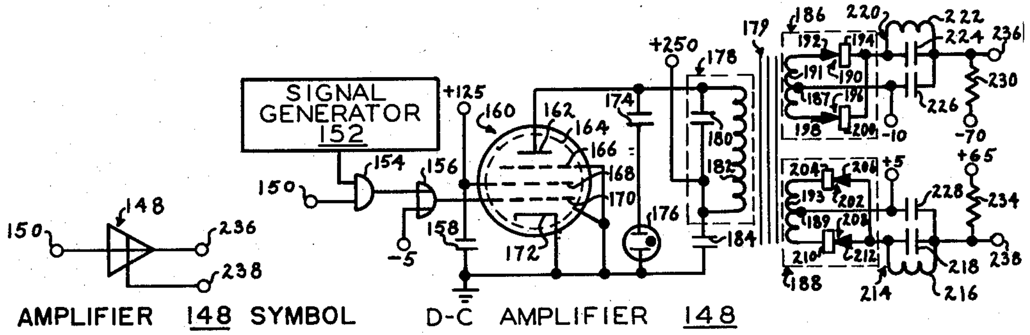
Fig. 7 shows the logical symbol for a D.-C. amplifier.
Fig. 7a is a detailed diagram of a D.-C. amplifier.

The symbol for a representative D.-C. amplifier 148 is shown in Fig. 7. When a positive signal is present at the input terminal 150, a positive signal of five volts appears at the positive output terminal 236 and a negative signal of ten volts is present at the negative output terminal 238. If a negative potential is present at the input terminal 150, the potentials at the output terminals 236 and 238 are reversed.

As shown in Fig. 7*a*, the D.-C. amplifier 148 includes the gate 154, the buffer 156, the vacuum tube 160, the transformer 179, the full-wave rectifiers 186 and 188, and the filters 220 and 214.

The input terminal 150 is connected to one input terminal of the gate 154. The other input of the gate 154 is fed a one megacycle carrier signal from the signal generator 152 which is a signal generator of known type. The megacycle carrier signal swings from minus ten to plus five volts.

One input of the buffer 156 is connected to the output of the gate 154. The other input of the buffer 156 is connected to the negative supply bus 5. The buffer 156 couples the output of the gate 154 to the control grid 170 of the vacuum tube 160.

The vacuum tube 160 is a five element tube having a grounded cylindrical shield 164, and includes the anode 162 connected via the primary winding 182 of the transformer 179 to a positive supply bus 250. The junction of the positive supply bus 250 and the primary winding 182 is coupled via the capacitor 184 to ground. The vacuum tube 160 also includes the suppressor grid 166 which is connected to ground, the screen grid 168 which is connected to the positive supply bus 125 and via the capacitor 158 to ground, and the cathode 172 which is grounded.

The anode 162 of the vacuum tube 160 is also connected via the coupling capacitor 174 to the neon tube 176 which is grounded. The capacitor 180 is connected in parallel with the primary winding 182 of the transformer 179 to form the parallel tank circuit 178 which is tuned to the frequency of the carrier signal.

The full-wave rectifier 186 is connected to the secondary winding 191 having its center tap 187 connected to the negative supply bus 10. The full-wave rectifier 186 includes the pair of crystal diodes 190 and 196. The anodes 192 and 198 of the crystal diodes 190 and 196 are respectively coupled to opposite ends of the secondary winding 191 of the transformer 179, and the cathodes 194 and 200 of the crystal diodes 190 and 196 are interconnected.

The full-wave rectifier 188 is connected to the secondary winding 193 having its center tap 189 connected to the positive supply bus 5.

The full-wave rectifier 188 includes the pair of crystal diodes 202 and 208. The anodes 204 and 210 of the crystal diodes 202 and 208 are coupled to opposite ends of the secondary winding 193, and the anodes 206 and 212 of the crystal diodes 202 and 208 are connected together.

The filter 220 which couples the cathodes 194 and 200 of the crystal diodes 190 and 196 to the positive output terminal 236 is a parallel tank circuit which includes the capacitor 224 and the inductor 222. The capacitor 226 connects the positive output terminal 236 to the negative supply bus 10. The positive output terminal 236 is also coupled via the resistor 230 to the negative supply bus 70.

The filter 214, which couples the anodes 206 and 212 of the crystal diodes 202 and 208 to the negative output terminal 238, is a parallel tank circuit which includes the capacitor 218 and the inductor 216. The capacitor 228 connects the negative output terminal 238 to the positive supply bus 5. The negative output terminal 238 is also coupled by the resistor 234 to the positive supply bus 65.

Initially, the crystal diodes 190 and 196 are in a conductive state such that the potential at the positive output terminal 236 is approximately minus ten volts. Similarly, the crystal diodes 202 and 208 are initially in a conductive state such that the potential at the negative output terminal 238 is approximately plus five volts.

When a signal is fed to the input terminal 150 it is combined with the one megacycle carrier and fed to the buffer 156. As previously noted, one input terminal of the buffer 156 is connected to a negative five volts supply bus so that all signals at the output of gate 154 which are equal to or more positive than minus five volts will be passed by the buffer 156. A signal passed by the buffer 156 is applied to the control grid 170 of the vacuum tube 160. The signal is amplified by vacuum tube 160 and appears across the parallel tank circuit 178. The parallel tank circuit 178 is tuned to the frequency of the incoming signal so that the maximum signal will be passed by the parallel tank circuit 178 to the full-wave rectifiers 186 and 188.

The full-wave rectifier 186 delivers a positive signal which is then filtered by the filter 220 to appear as a positive direct-current potential of approximately five volts at the positive output terminal 236. The full-wave rectifier 188 delivers a negative signal which is then filtered by the filter 214 to appear as a negative direct-current potential of approximately ten volts at the negative output terminal 238.

Thus, if a positive signal is present at the input terminal 150, the voltage at the positive output terminal 236 is plus five volts, and the potential at the negative output terminal 238 is minus ten volts. However, if no signal is present at the input terminal 150, the voltage at the positive output terminal 236 will be minus ten volts, and the potential at the negative output terminal 238 will be plus five volts.

Generally, it should be noted that this D.-C. amplifier is a carrier type D.-C. amplifier with positive and negative output signals comprising only one vacuum tube and producing output signals equal in magnitude to the input signals. It should also be noted that the D.-C. amplifier includes a transformer and rectifiers for producing output signals of the desired magnitude from a low impedance source, the D.-C. amplifier thereby being especially adaptable for use in conjunction with networks of crystal diodes.

In the description which follows, the D.-C. amplifier may at times be referred to simply as an amplifier, and the fact that the amplifier is a D.-C. amplifier will be apparent from the use of the symbol shown in Fig. 7.

*Set dominant flip flop*

A set dominant flip flop of the type used in the frequency dividing system is a bi-stable electronic circuit with two output terminals, one of which is maintained at one potential level and the other of which is maintained at a second potential level to indicate one stable state. Upon receipt of a signal of suitable magnitude at its input the potential levels of the two output terminals are interchanged to indicate a second stable state.

The symbol for a representative set dominant flip flop 240 is illustrated in Fig. 8. The set dominant flip flop 240 comprises the input terminal 242, two reset terminals 251, 253, positive output terminal 254, and negative output terminal 256.

One stable state of the set dominant flip flop 240 is the normal condition which is designated "reset" and exists when a negative potential of ten volts appears at the positive output terminal 254 and a positive potential of five volts appears at the negative output terminal 256. The second stable state is designated "set" and exists when a positive potential of five volts appears at the positive output terminal 254 and a negative potential of ten volts appears at the negative output terminal 256.

The set dominant flip flop 240 is set when a positive input signal is received via its input terminal 242, and this is true irrespective of any reset signal which may simultaneously be transmitted to the reset terminals 251 or 253 of the set dominant flip flop 240.

Once set, the set dominant flip flop remains set as long as positive signals are received via the reset terminal 251 even though the "setting" pulse or signal has terminated. When the signal received via a reset terminal such as 251 becomes negative, the set dominant flip flop 240 is reset unless a positive pulse or signal is simultaneously being received via the input terminal 242.

Stated more generally, the set dominant flip flop 240 is set by the receipt of a positive input signal via the input terminal 242 and is reset by a coincidence of a negative input signal and at least one reset signal. After being reset, the set dominant flip flop 240 remains reset until the above recited set conditions are fulfilled.

The detailed circuitry of the set dominant flip flop 240 is illustrated in Fig. 8*a* employing some of the logical symbols previously described.

The set dominant flip flop 240 comprises the buffer 246, the D.-C. amplifier 252 and the gate 248.

The input terminal 242 is the input terminal of the buffer 246. A positive signal which is transmitted to the input terminal 242 is passed through the buffer 246 to the D.-C. amplifier 252, and causes the D.-C. amplifier 252 to generate a positive potential of five volts at its positive output terminal 254 and a negative potential of ten volts at its negative output terminal 256.

The gate 248 couples the positive output terminal 254 of the D.-C. amplifier 252 to the buffer 246. When a positive signal is present at the reset terminals 251 and 253, the gate 248 passes the positive signal to the buffer 246. Thus a feedback path is provided which enables the positive potential of five volts to be maintained at the positive output terminal 254 and which is blocked only when a negative signal causes the gate 248 to be blocked.

It should be noted that a reset signal which causes the gate 248 to be blocked will not prevent a set signal at the buffer 246 from causing the D.-C. amplifier 252 to generate a positive potential of five volts at its positive output terminal 254 during the existence of the set signal.

In the text which follows, the set dominant flip flop may be referred to simply as a flip flop and the quality of being set dominant will be apparent from the use of the symbol shown in Fig. 8.

*Reset dominant flip flop*

A reset dominant flip flop of the type used in the frequency dividing system is a bi-stable electronic circuit with two output terminals, one of which is maintained at one potential level and the other of which is maintained at a second potential level to indicate one stable state. Upon the receipt of at least two signals of suitable magnitude the potential levels of the two output terminals are exchanged to indicate a second stable state.

The symbol for a representative reset dominant flip flop 258 is illustrated in Fig. 9. The reset dominant flip flop 258 comprises the input terminal 260, the reset terminal 268, positive output terminal 272 and one negative output terminal 274.

One stable state of the reset dominant flip flop 258 is the normal condition which is designated "reset" and exists when a negative potential of ten volts appears at the positive output terminal 272 and a positive potential of five volts appears at the negative output terminal 274. The other stable state is designated "set" and exists when a positive potential of five volts appears at the positive output terminal 272 and a negative potential of ten volts appears at the negative output terminal 274.

The reset dominant flip flop 258 is set when a positive signal is received via its input terminal 260, and a positive signal is present at its reset terminal 268. Therefore, the reset dominant flip flop 258 will not be set if a reset (negative) signal is present at the reset terminal 268.

Once set, the reset dominant flip flop 258 remains set as long as a positive signal is received via the reset terminal 268 even though the "setting" signal has terminated, but when the signal at the reset terminal 268 is negative, the reset dominant flip flop 258 is then reset.

After being reset, the reset dominant flip flop 258 remains reset until the above recited set conditions are fulfilled.

The detailed circuitry of the reset dominant flip flop 258 is illustrated in Fig. 9*a* in which use is made of logical symbols previously described.

The reset dominant flip flop 258 comprises the buffer 264, the gate 266 and the D.-C. amplifier 270 connected in series. The input terminal 260 is the input terminal of the buffer 264.

The buffer 264 is coupled to the gate 266. The reset terminal 268 is also coupled to the gate 266. When the gate 266 receives positive signals coincidentally from the buffer 264 and the reset terminal 268, the gate 266 passes a positive signal to the D.-C. amplifier 270, and causes the D.-C. amplifier 270 to generate a positive potential of five volts at its positive output terminal 272 and a negative potential of ten volts at its negative output terminal 274.

The positive output terminal 272 is coupled directly to the buffer 264 so that when a positive signal is generated at the positive output terminal 272, it is regenerative. The positive signal will be maintained at the positive output terminal 272 until the gate 266 is blocked by a negative signal received via the reset terminal 268.

It should be noted that a negative signal at the reset terminal 268 will prevent a positive pulse or signal at the input terminal 260 from setting the reset dominant flip flop 258.

In the text which follows, the reset dominant flip flop may be referred to simply as a flip flop and the quality of being reset dominant will be apparent from the use of the symbol shown in Fig. 9.

Referring now to Fig. 10, a detailed logical circuit diagram of the frequency dividing system shown in Fig. 1 is shown. For purposes of explanation, it will be assumed that the frequency dividing system is to produce a signal having a frequency of $f'=f/744$ or $f''=f/747$ as shown in Figs. 1 and 11, when a cyclical clock pulse signal C0 having a fundamental frequency $f$ is applied to the system.

A sinusoidal signal source of relatively constant frequency is connected to the pulse generator 2 (see Fig. 10) which converts the sinusoidal signal into a fundamental frequency cyclical clock pulse signal C0. The pulse generator 2 is connected to a binary counter 4 and a cycling unit 6.

The cycling unit 6 comprises a delay line 290 (one half a pulse time delay) and two pulse amplifiers 292 and 294. The clock pulse signal C0, delayed a quarter of a pulse period, is tapped off the delay line 290 and is amplified by pulse amplifier 292 to produce a cyclical signal C1, ninety degrees out of phase with the cyclical clock pulse signal C0. The clock pulse signal C0 is also delayed one half of a pulse period and is amplified by pulse amplifier 294 to produce a cyclical signal C2, one hundred and eighty degrees out of phase with the clock pulse signal C0. These cyclical signals are used in the system for retiming and reshaping purposes.

The binary counter 4 is a three stage binary counter which comprises the stages **275*a*, 275*b* and 275*c***.

The stage **275*a*, which is the first stage of the binary counter 4, is coupled to stage 275*b* via the delay line 286*a* (three-quarters of a pulse time delay) and via the stage coupling line 277*a* by way of the gate 288*a*. The stage 275*b* is coupled to the stage 275*c* via the delay line 286*b* (three quarters of a pulse time delay) and the stage coupling line 277*b* by means of the gate 288*b*. The stage 275*c* is coupled to the output line 279 of the binary counter 4 via the delay line 286*c* (three-quarters of a pulse time delay) and the stage coupling line 277*c* by way of the gate 288*c***.

The stages **275*a* to 275*c* generate signals which represent a three digit binary member wherein the stage 275*a*** produces the signal which represents the least significant binary digit and each succeeding stage produces a signal which represents the next more significant digit.

The cyclical signal C0 which is fed into the stage **275*a* is the signal which is counted, and as each C0 signal is received by the binary counter 4** the next successive binary number is represented.

The cyclical pulse C0 is forwarded via the stage coupling lines 277 through each successive stage 275 of the binary counter 4 until blocked at the input terminal of a particular stage 275. A stage 275 may be blocked as the result of a negative signal fed via the associated delay line from the prior stage 275. More particularly, if the stage **275*a* is producing a positive signal (hereinafter designated "set"), the C0 cyclical pulse enters the stage 275*a* and causes the stage 275*a* and each successive set stage 275 of the binary counter 4 to be reset until the first stage 275 is encountered which is reset. The cyclical pulse C0 causes this reset stage 275 to be set and C0 is blocked at the input terminal of the next successive stage 275**.

In this manner the binary counter 4 functions to produce signals which represent a three digit binary number which is increased numerically by one each time C0 is transmitted to the operative binary counter 4.

The logical details of a typical stage (the stage **275*b***) will be described.

When the flip flop 282 is reset, a negative signal appears at its positive output terminal and a positive signal appears at its negative output terminal. The positive signal is fed via the delay line 284 to the gate 278 (which is coupled to the input terminal of the flip flop 282) and to the buffer 280 (which is coupled to one of the reset terminals of the flip flop 282).

When the gate **288*a* is primed by a positive signal which is transmitted from the stage 275*a* via the delay line 286*a* and the gate 288*a*, the next C0 pulse which is transmitted from the stage 275*a* via the stage coupling line 277*a* passes through the gate 288*a* to the amplifier 276. The amplifier 276 transmits the C0 pulse to the gate 278. The gate 278 is primed by the positive signal which is transmitted from the negative output terminal of the flip flop 282 via the delay line 284. The delay line 284 maintains the positive signal for three-quarters of a pulse time after the flip flop is set to insure that the gate 278 is not blocked until the flip flop 282 is set. The C0 pulse is also transmitted as a negative pulse from the negative output of the amplifier 276 to the buffer 280 but does not affect the potential of the output of this buffer since the other input of the buffer 280 is being held positive by the signal from the delay line 284. This signal remains positive for three quarters of a pulse time after the flip flop 282 is set, by which time the negative pulse has ended and the negative output of the amplifier 276 is again positive. Hence, during the sequence of events just described the output of the buffer 280 remains positive at all times, and no negative signal appears at the reset terminal of the flip flop 282** to interfere with its setting.

The C0 pulse is also transmitted from the positive output terminal of the amplifier 276 via the stage coupling line **277*b* to the input terminal of the gate 288*b* and bypasses the major portion of the stage 275*b*. Until the flip flop 282 is set, however, a negative signal is transmitted from its positive output terminal via the delay line 286*b* to block the gate 288*b*, and therefore the pulse transmitted to stage 275*c* from the amplifier 276 has no effect on stage 275*c***.

When the stage **275*b* is generating a positive signal at the positive output terminal of the flip flop 282, the next C0 pulse received by the stage 275*b* causes a negative potential to appear at the negative output terminal of the amplifier 276. This negative potential is transmitted to the buffer 280. Since the flip flop 282 is set, a negative potential appears at its negative output terminal and is transmitted via the delay line 284 to the buffer 280. As both signals being fed to the buffer 280 are negative, the buffer 280 transmits a negative potential to one of the reset terminals of the flip flop 282 which is thus reset. The negative signal from the delay line 284 blocks the gate 278, thus preventing the positive pulse from the amplifier 276 from reaching the flip flop 282 and interfering with its resetting. Again the delay line 284 causes the signals fed by it to the gate 278 and the buffer 280 to remain until after the pulse from the amplifier 276 has ended. The flip flop 282 may also be reset by a signal received from the variable unit 18** as will be hereinafter indicated.

A C0 pulse received by the stage **275*b*, when that stage is set, in addition to resetting the stage 275*b* as just described, will also set the stage 275*c*. This occurs because, when the stage 275*b* is set, its positive output terminal transmits a positive signal via the delay line 286*b* to the gate 288*b*, thus permitting the next pulse received from the amplifier 276 to set the stage 275*c***.

Each of the remaining stages of the binary counter 4 functions in a similar manner and comprises the same elements with the same connections.

The binary counter 4 applies an output pulse via output line 279 to an eight pulse time delay recirculating register 9 which is composed of a unit adder 8 and a delay line and reshaper unit 10.

The unit adder 8 responds to the output pulses from the binary counter 4 and functions to increase by one the number circulating in the recirculating register 9. The normal recirculation path of the recirculating register 9 includes gate 300, reshaper 308, delay line 310 and reshaper 312 in series.

A signal corresponding to the number circulating in the recirculation loop will pass through gate 300 to the reshaper 308, then via delay line 310 (seven and one half pulse times delay) to reshaper 312. The signal is then fed back via the positive output terminal of reshaper 312 to the gate 300.

When the signal passes through the reshaper 308, it is timed and reshaped by a C2 pulse. The signal passing through the reshaper 312 is timed and reshaped by a C1 pulse. Since each of the reshapers 308 and 312 introduces a delay of one-quarter of a pulse period, the total delay of the recirculation loop is eight pulse periods.

The number circulating through the recirculating register 9 remains constant until the unit adder 8 causes the circulating number to be numerically increased by one.

The unit adder 8 comprises the reshaper 296 for timing and reshaping the output pulse of the binary counter 4 with C1 pulses; the gates 300, 302 and 304 operative in accordance with the condition of the positive and negative output terminals of reshapers 296 and 312; and a delay line 306 (three-quarters of a pulse period delay).

The positive output terminal of reshaper 296 is normally at a negative potential while the negative output terminal is at a positive potential. When an output pulse from binary counter 4 is applied to reshaper 296, the potential condition of the output terminals is reversed. The timing of the pulse pattern representing the number circulating in the recirculating register 9 is to be interpreted such that the least significant binary digit (i.e., the units digit) coincides in time with the output pulse from the binary counter 4.

When the least significant binary diigt of the number circulating in the recirculating register 9 passes through the reshaper 312 and has a value of zero, this is equivalent to the absence of a pulse at this time, so the positive output terminal of reshaper 312 will be at a negative potential while the negative output terminal will be at a positive potential. When the least significant binary digit of the number is one, the potential condition of the outpu terminals of reshaper 312 is reversed.

In general, if a binary digit one is passing through the reshaper 312 and nothing is to be added to this value by the unit adder 8, the binary digit one will pass through gate 300 and enter reshaper 308 as a positive pulse representing the sum of binary digits one and zero; namely, binary digit one due to the coincidence of positive potentials at gate 300 from the positive output terminal of reshaper 312 and the negative output terminal of reshaper 296.

To explain the operation of the recirculating register 9 some typical cases of binary additions of a unit follows:

| I | II | III |
|---|---|---|
| 00000010<br>00000001 | 00000001<br>00000001 | 00000011<br>00000001 |
| 00000011 | 00000010 | 00000100 |

In each case a binary digit one is to be added to the least significant digit of the number circulating in the recirculation loop of the recirculating register 9.

In case I the binary digit one will pass through gate 302 and enter reshaper 308 as a positive pulse representing the sum of binary digits zero and one; namely, binary digit one due to the coincidence of positive potentials at gate 302 from the negative output terminal of reshaper 312 and the positive output terminal of reshaper 296.

In case II the rule that binary digit one plus binary digit one equals binary digit zero plus a carry of binary digit one into the next significant binary digit position must be satisfied. The sum of binary digit one plus binary digit one equalling binary digit zero is assured due to the negative potentials at gates 300 and 302 from the negative output terminals of reshapers 296 and 312 respectively. This causes a negative potential representing the binary digit zero to be applied to the reshaper 308.

A binary digit one will be passed by gate 304 as a positive pulse representing the carry to the next significant binary digit position due to the coincidence of positive potentials at gate 304 from the positive output terminals of reshapers 296 and 312. This pulse is delayed by delay line 306 by an amount sufficient to make it coincide, after reshaping by a C1 pulse, with the next significant binary digit of the number circulating in the recirculating register 9. Since the next significant binary digit is zero, the carry over binary digit one is passed through gate 302 and enters reshaper 308 as a positive pulse representing the sum of binary digits one and zero due to the coincidence of positive potentials at gate 302 from the positive output terminal of reshaper 296 and the negative output terminal of reshaper 312.

If the next significant binary digit had been one, as in case III, gates 300 and 302 would again be blocked and a negative potential representing the binary digit zero would be applied to the reshaper 308. A binary digit one would be passed by gate 304 and delayed by an amount sufficient to make it coincide with the third significant binary digit of the number circulating in the recirculating register 9.

Thus, it is apparent that a predetermined integral multiple of eight may be built up in the recirculating register 9 by adding a unit to the circulating number for every eighth cyclical clock pulse C0.

The recirculating register 9 is connected to a coincidence circuit 12 which functions to produce a control pulse when a predetermined integral multiple of eight is reached by the recirculating register 9.

If the predetermined integral multiple of eight has a value of ninety-three, then the coincidence circuit 12 must produce an output pulse when the ninety third pulse is applied to the recirculating register 9.

Thus, when the number ninety two, represented by 01011100 in binary form, is circulating in the recirculating register 9 it will be noted that the third, fourth, fifth and seventh significant binary digits are one while the sixth significant binary digit is zero. Leads 314, 316, 318, 320 and 326 are tapped off the delay line and reshaper unit 10 corresponding to these binary digits. Leads 314, 316, 318 and 326 are connected directly to a gate while lead 320 corresponding to the sixth significant binary digit is connected to an amplifier 322 whose negative output terminal is connected via lead 324 to the gate 328. The positive output terminal of reshaper 296 is also connected directly to the gate 328.

Therefore, when the ninety-third pulse is applied to the recirculating register 9, the corresponding pulses of the circulating number ninety two are so positioned that the lines 314, 316, 318, 324 and 326 are at a positive potential thereby conditioning the gate 328 to pass the ninety third pulse after being reshaped by a C1 pulse in the reshaper 296.

It should be apparent that by proper design of the coincidence circuit 12 any predetermined integral multiple of eight, up to the capacity of the recirculating register 9, may be used to condition the gate 328. In general, if the $m$th output pulse from the binary counter 4 is to be detected, the inputs to the coincidence circuit 12 from the recirculating register 9 must correspond to the number $m-1$.

In one position of the switching unit 13, the coincidence circuit 12 is connected to a clear circuit 14 and a delay line and reshaper unit 16. The clear circuit 14 functions to clear the recirculating register 9 for repeating the process to obtain frequency division, while the delay line and reshaper unit 16 is used for timing the control pulse in accordance with the cyclical clock pulse C0.

More specifically, the clear circuit 14 is composed of a flip flop 332 connected to the output of coincidence circuit 12, a delay line 334 (three-quarters of a pulse period delay), and a buffer 336. The negative output terminal of flip flop 332 is connected to the clock gate of reshaper 308 and to the delay line 334. The output of delay line 334 and the negative output terminal of reshaper 296 are connected to the input of buffer 336. The output terminal of buffer 336 is connected to the reset terminal of flip flop 332.

In operation, the control pulse from gate 328 corresponding to the reshaped ninety third pulse is applied to the clear circuit 14 to set flip flop 332. The resulting negative potential at the negative output terminal of flip flop 332 is applied to the clock gate of reshaper 308 and via delay line 334 to one input of buffer 336. The reshaped ninety-third pulse also causes a negative potential, from the negative output terminal of reshaper 296, to be applied to the other input of buffer 336. Thus, the negative potential from flip flop 332 is delayed a sufficient amount of time to prevent coincidence of the negative potentials and consequent resetting of flip flop 332 at the time the reshaped ninety-third pulse is produced.

The negative potential at the clock gate of reshaper 308 blocks the recirculation loop of the recirculating register 9 for a period equal to the set period of the flip flop 332. The flip flop remains set for eight pulse periods (which is sufficient to entirely clear the recirculating register 9) whereupon the ninety-fourth reshaped pulse causes a negative potential, from the negative output terminal of reshaper 296, to be applied via buffer 336 to the reset terminal of flip flop 332. The clear circuit 14 is reset and prepared for the next control pulse from the coincidence circuit 12.

The delay line and reshaper unit 16 is composed of a delay line 338 (one half of a pulse period delay) and a reshaper 340 connected to the output terminal 20, and functions to reshape the control pulse from the coincidence circuit 12 according to the cyclical clock pulse C0.

Since the control pulse representing the ninety-third multiple of eight or seven hundred and forty-four is delayed a quarter of a pulse period by the reshaper 296, it is delayed an additional one half of a pulse period by the delay line 338 so that it may be timed to gate the leading edge of the seven hundred and forty-fifth cyclical clock pulse C0 produced by the pulse generator 2 and applied to the output terminal 20. The seven hundred and forty-fifth cyclical clock pulse C0 is simultaneously applied to the binary counter 4 to repeat the process for obtaining the predetermined frequency division of $f/744$.

When the switching unit 13 is operated for obtaining a signal having a frequency equal to the fundamental frequency divided by an integral number having a value intermediate successive multiples of eight, as for example $f/747$, the coincidence circuit 12 is connected via the clear circuit 14 and switch **13*a* to a variable unit 18 rather than to unit 16 through switch 13*e***.

The clear circuit 14 functions, as before, to clear the recirculating register 9 but additionally functions to apply a positive signal, from the positive output terminal of the flip flop 332, through switch **13*a* to the variable unit 18 for a period of at least eight pulse periods following each control pulse produced by the gate 328**.

Variable unit 18 is composed of a gate 344, amplifier 345, delay line 346 (three quarters of a pulse period delay) and reshaper 348 connected to the output terminal 21.

The delay line **284*a* in the first stage 275*a* of binary counter 4 is connected to one input of gate 344 through switch 13*c*, the delay line 286*b* in binary counter 4 is connected through switch 13*b* to a second input of gate 344, the positive output terminal of flip flop 332 is connected through switch 13*a* to a third input of gate 344 and the pulse generator 2 is connected to a fourth input of gate 344. The output terminal of gate 344 is coupled to amplifier 345 and delay line 346. The negative output terminal of amplifier 345 is connected through switch 13*d* to one of the reset terminals of flip flop 282*a* in the first stage 275*a* and to a similar one of the reset terminals of flip flop 282 in the second stage 275*b* of binary counter 4. The delay line 346 is connected via the reshaper 348 to the output terminal 21**.

In operation the control pulse from gate 328 corresponding to the seven hundred and forty-fourth cyclical clock pulse C0 will set flip flop 332 causing a positive potential to be applied to gate 344. The next two cyclical clock pulses C0 will be counted by the binary counter 4 and when the seven hundred and forty-seventh cyclical clock pulse C0 is simultaneously applied to gate 344 and binary counter 4, positive potentials will be applied via lines 347 and 349 to the gate 344 permitting the seven hundred and forty-seventh cyclical clock pulse C0 to be passed to delay line 346 and amplifier 345.

A negative potential will be applied from the negative output terminal of amplifier 345 to reset the first and second stages **275*a* and 275*b* of the binary counter 4 since they are both in a set condition after the application of the seven hundred and forty-seventh clock pulse C0 to the binary counter 4. The first and second stages 275*a* and 275*b* will, therefore, be reset and the binary counter 4 cleared. The positive pulse applied to the delay line 346 is delayed three quarters of a pulse period so that it may be timed and reshaped with the seven hundred and forty-eighth cyclical pulse C0 before being applied to the output terminal 21. The seven hundred and forty-eighth cyclical pulse C0 is simultaneously applied to the binary counter 4** to repeat the process for obtaining a frequency division of $f/747$.

The connections through switching unit 13 between the binary counter 4 and the gate 344 will depend on the desired division ratio, and in particular it may sometimes be necessary to connect stage **275*c* to gate 344. Similarly, the negative output of amplifier 345 may have to be connected to stage 275*c***, but may not be needed on one or both of the other stages.

It will be evident from the foregoing that the invention is not limited to the specific circuits and arrangements of parts shown and disclosed herein for illustration but that the underlying concept of the invention is susceptible of numerous variations and modifications coming within the broader scope and spirit thereof as defined by the appended claims. Accordingly the specification and drawings are to be regarded in an illustrative sense.

What is claimed is:

1. A frequency dividing system for deriving a signal having a predetermined frequency which is a submultiple of a fundamental frequency signal comprising signal producing means responsive to the fundamental frequency signal for producing primary signals having a frequency equal to the fundamental frequency divided by a predetermined integral number and secondary signals representing a predetermined number having a value less than that of the first mentioned number, a unit adder, a recirculation register associated with said unit adder and responsive to the primary signals to count said primary signals, a detector controlled by said register for producing an output signal for every predetermined number of primary signals produced by said signal producing means, and pulsing means responsive to said fundamental frequency, said secondary signals and said output signals for producing a signal having a frequency equal to the predetermined frequency.

2. A frequency dividing system for deriving a signal having a predetermined frequency from a signal having a fundamental frequency $f$ comprising a binary counter responsive to the fundamental frequency signal for producing primary signals at a frequency $f/2^n$ and secondary signals representing a predetermined number having a value less than $2^n$, a recirculating register including a unit adder for counting the primary signals, a coincidence detector for producing an output signal when the count in said recirculating register reaches a predetermined number, and second means responsive to the fundamental frequency signal, said secondary signals, and said output signals for producing a signal in phase with the fundamental frequency signal and having a frequency equal to the predetermined frequency.

3. A frequency dividing system for deriving a signal having a predetermined frequency $f/x$ from a signal having a fundamental frequency $f$ comprising a first means responsive to the fundamental frequency signal for producing primary signals at a frequency equal to the fundamental frequency divided by a number having a value equal to a chosen radix raised to an integral power and secondary signals representing a predetermined number having a value less than that of the first mentioned number, a recirculating register comprising a unit adder and a delay line and reshaper unit connected in a closed loop, said recirculating register functioning to store a number which is numerically increased by one for each primary signal applied to said unit adder, a coincidence circuit coupled to said recirculating register in such a manner that when a predetermined number is stored in said recirculating register it conditions said coincidence circuit to detect the next primary signal and produce a control signal, and means responsive to certain ones of the signals for producing a signal having a frequency of $f/x$.

4. A frequency dividing system for deriving a signal having a predetermined frequency which is a submultiple of a fundamental frequency signal comprising first means responsive to the fundamental frequency signal for producing primary signals at a frequency equal to the fundamental frequency divided by a number having a value equal to a chosen radix raised to an integral power and secondary signals representing a predetermined number having a value less than that of the first mentioned number, a recirculating register comprising a unit adder and a delay line and reshaper unit connected in a closed loop, said unit adder including a reshaping circuit responsive to the primary signals and the fundamental frequency signal for reshaping the primary signals in accordance with the fundamental frequency signal, said recirculating register functioning to store a number which is numerically increased by one for each primary signal applied to said unit adder, a coincidence circuit coupled to said recirculating circuit in such a manner that when a predetermined number is stored in said recirculating register it conditions said coincidence circuit to detect the next reshaped primary signal and produce a control signal, and means responsive to the fundamental frequency signal and certain ones of the other signals for producing a signal in phase with the fundamental frequency signal and having a frequency of $f/x$.

5. A frequency dividing system for deriving a signal having a predetermined frequency $f/x$ from a signal having a fundamental frequency $f$ comprising a binary counter responsive to the fundamental frequency signal for producing primary signals at a frequency $f/2^n$ and secondary signals representing a number less than $2^n$, a recirculating register comprising a unit adder and a delay line and reshaper unit connected in a closed loop, said recirculating register functioning to store a number which is numerically increased by one for each primary signal applied to said unit adder, a coincidence circuit coupled to said recirculating circuit in such a manner that when a predetermined number is stored in said recirculating register it conditions said coincidence circuit to detect the next primary signal and produce a control signal, and means responsive to certain ones of the signals for producing a signal having a frequency $f/x$.

6. A frequency dividing system for deriving a signal having a predetermined frequency $f/x$ from a signal having a fundamental frequency $f$ comprising a binary counter responsive to the fundamental frequency signal for producing primary signals at a frequency $f/2^n$ and secondary signals representing a number less than $2^n$ a recirculating register comprising a unit adder and a delay line and reshaper unit connected in a closed loop, said unit adder including a reshaping circuit responsive to the primary signals and the fundamental frequency signal for reshaping the primary signals in accordance with the fundamental frequency signal, said recirculating register functioning to store a number which is numerically increased by one for each primary signal applied to said unit adder, a coincidence circuit coupled to said recirculating circuit in such a manner that when a predetermined number is stored in said recirculating register it conditions said coincidence circuit to detect the next reshaped primary signal and produce a control signal, and means responsive to the fundamental frequency signal and certain ones of the other signals for producing a signal in phase with the fundamental frequency signal and having a frequency of $f/x$.

7. A frequency dividing system for deriving a signal having a predetermined frequency $f/x$ from a signal having a fundamental frequency $f$ comprising a binary counter responsive to the fundamental frequency signal for producing primary signals at a frequency $f/2^n$ and secondary signals representing a number less than $2^n$, a recirculating register comprising a unit adder and a delay line and reshaper unit connected in a closed loop, said unit adder including a reshaping circuit responsive to the primary signals and the fundamental frequency signal for reshaping the primary signals in accordance with the fundamental frequency signal, said recirculating register functioning to store a number which is numerically increased by one for each primary signal applied to said unit adder, a coincidence circuit coupled to said recirculating circuit in such a manner that when a predetermined number is stored in said recirculating register it conditions said coincidence circuit to detect the next reshaped primary signal and produce a control signal, and means responsive to the fundamental frequency signal and the control signals for producing a signal in phase with the fundamental frequency signal and having a frequency of $f/x$.

8. A frequency dividing system for deriving a signal having a predetermined frequency $f/x$ from a signal having a fundamental frequency $f$ comprising a binary counter responsive to the fundamental frequency signal for producing primary signals at a frequency $f/2^n$ and secondary signals representing a number less than $2^n$, a recirculating register comprising a unit adder and a delay line and reshaper unit connected in a closed loop, said unit adder including a reshaping circuit responsive to the primary signals and the fundamental frequency signal for reshaping the primary signals in accordance with the fundamental frequency signal, said recirculating register functioning to store a number which is numerically increased by one for each primary signal applied to said unit adder, a coincidence circuit coupled to said recirculating circuit in such a manner that when a predetermined number is stored in said recirculating register it conditions said coincidence circuit to detect the next reshaped primary signal and produce a control signal, a clear circuit responsive to the control signal for clearing said recirculating register before it receives the next succeeding primary signal, and means co-jointly responsive to the fundamental frequency signal and the control signals for producing a signal in phase with the fundamental frequency signal and having a frequency of $f/x$.

9. A frequency dividing system for deriving a signal having a predetermined frequency which is a submultiple of a fundamental frequency signal $f$ comprising first means responsive to the fundamental frequency signal for producing primary signals at a frequency $f/2^n$ and secondary signals representing a predetermined number, $s$, having a value less than $2^n$, a unit adder, a recirculation register including said unit adder responsive to the primary signals for producing an output signal for every predetermined number, $m$, of primary signals produced by said first means, and second means responsive to the fundamental frequency signal, the secondary signals and the output signals for producing a signal in phase with the fundamental frequency signal and having a frequency equal to the predetermined frequency where the predetermined frequency is equal to $f/[(2^n \times m)+(s)]$.

10. A frequency dividing system for deriving a signal having a predetermined frequency $f/x$ from a signal having a fundamental frequency $f$ comprising a binary counter responsive to the fundamental frequency signal for producing primary signals at a frequency $f/2^n$ and secondary signals representing a number less than $2^n$, a recirculating register comprising a unit adder and a delay line and reshaper unit connected in a closed loop, said unit adder including a reshaping circuit responsive to the primary signals and the fundamental frequency signal for reshaping the primary signals in accordance with the fundamental frequency signal, said recirculating register functioning to store a number which is numerically increased by one for each primary signal applied to said unit adder, a coincidence circuit coupled to said recirculating circuit in such a manner that when a predetermined number is stored in said recirculating register it conditions said coincidence circuit to detect the next reshaped primary signal and produce a control signal, and means responsive to the fundamental frequency signal, the secondary signals and the control signals for producing a signal in phase with the fundamental frequency signal and having a frequency of $f/x$.

11. A frequency dividing system for deriving a signal having a predetermined frequency $f/x$ from a signal having a fundamental frequency $f$ comprising a binary counter responsive to the fundamental frequency signal for producing primary signals at a frequency $f/2^n$ and secondary signals representing a number less than $2^n$, a recirculating register comprising a unit adder and a delay line and reshaper unit connected in a closed loop, said unit adder including a reshaping circuit responsive to the primary signals and the fundamental frequency signal for reshaping the primary signals in accordance with the fundamental frequency signal, said recirculating register functioning to store a number which is numerically increased by one for each primary signal applied to said unit adder, a coincidence circuit coupled to said recirculating circuit in such a manner that when a predetermined number is stored in said recirculating register it conditions said coincidence circuit to detect the next reshaped primary signal and produce a first control signal, a clear circuit responsive to the first control signal for producing a second control signal and a clear signal, the clear signal being applied to clear said recirculating register before the next succeeding primary signal is applied thereto, and means responsive to the fundamental frequency signal, the secondary signals and the second control signals for producing a signal in phase with the fundamental frequency signal and having a frequency of $f/x$.

12. A frequency dividing system for deriving a signal having a predetermined frequency from a signal having a fundamental frequency comprising a first means responsive to the fundamental frequency signal for generating signals at a frequency equal to the fundamental frequency divided by a predetermined number, a recirculating circuit comprising a unit adder and a delay line and reshaper unit connected in a closed loop, said recirculating circuit being responsive to said generated signals and functioning to store a number which is numerically increased by one for each generated signal, a coincidence circuit coupled to said recirculating circuit in such a manner that when a predetermined number is stored in said recirculating circuit it conditions said coincidence circuit to detect the next generated signal and produce a control signal, and means responsive to certain ones of the signals for producing a signal having said predetermined frequency.

13. A frequency dividing system for deriving a signal having a predetermined frequency from a signal having a fundamental frequency comprising a counter responsive to the fundamental frequency signal for generating signals at a given frequency which is less than said fundamental frequency, a recirculating circuit responsive to said generated signals and comprising a unit adder and a delay line and reshaper unit connected in a closed loop, said recirculating circuit functioning to store a number which is numerically increased by one for each generated signal applied to said recirculating circuit, a detection circuit coupled to said recirculating circuit such that when a predetermined number is stored in said recirculating circuit it conditions said detection circuit to detect the next generated signal and produce a control signal, and means responsive to certain ones of the signals for producing a signal having said predetermined frequency.

14. A frequency dividing system for deriving a signal having a predetermined frequency from a signal having a fundamental frequency comprising signal generating means responsive to the fundamental frequency signal for generating signals at a frequency equal to the fundamental frequency divided by a predetermined number, a recirculating register including an adder coupled to said signal generating means, said recirculating register functioning to store a number which is numerically increased by one for each generated signal, a detection circuit coupled to said recirculating register in such a manner that when a predetermined number is stored in said recirculating register it conditions said detection circuit to produce a control signal, and means responsive to certain ones of the signals for producing a signal having said predetermined frequency.

15. A frequency dividing system for producing a signal which is a predetermined submultiple of a signal having a fundamental frequency, said system comprising a counter for producing a primary signal in response to application thereto of a preselected number of cycles of said fundamental frequency signal and for also providing secondary signals representing application thereto of less than said preselected number of cycles, a cyclic counter for continuously circulating a signal representing a number, an add-one circuit responsive to said primary signals and to said circulating signal to change the circulating signal to a signal representing the next consecutive number, a detection circuit to produce a control signal when said circulating signal represents a desired number and a pulse producing means responsive to said control signals, said secondary signals and said fundamental frequency signal for generating a signal having said predetermined submultiple frequency.

16. A frequency dividing system for deriving a signal having a predetermined frequency from a signal having a fundamental frequency, said system comprising a first means responsive to the fundamental frequency signal for producing signals at a submultiple frequency, a recirculation register to store a representation of a number, a unit adder responsive to the submultiple frequency signals and to the number representation in said recirculating register to maintain a count of said submultiple signals in said recirculating register, a detector for producing an output signal and clearing said recirculating register when the number represented in said register becomes a predetermined number, and output means responsive to the fundamental frequency signal and said output signal for producing a signal having a frequency equal to the predetermined frequency.

References Cited in the file of this patent

UNITED STATES PATENTS

| | | |
|---|---|---|
| 2,486,491 | Meacham | Nov. 1, 1949 |
| 2,521,774 | Bliss | Sept. 12, 1950 |
| 2,558,447 | MacSorley | June 26, 1951 |
| 2,629,827 | Eckert et al. | Feb. 24, 1953 |
| 2,674,733 | Robbins | Apr. 6, 1954 |
| 2,750,499 | Newman et al. | June 12, 1956 |
| 2,766,379 | Pugsley | Oct. 9, 1956 |

OTHER REFERENCES

West: "A Digital Computer for Scientific Applications," Proceedings of the IRE, pp. 1452 or 1454–1455, December 1948.